United States Patent [19]
Fronen et al.

[11] Patent Number: 5,742,196
[45] Date of Patent: Apr. 21, 1998

[54] LEVEL-SHIFTING CIRCUIT AND HIGH-SIDE DRIVER INCLUDING SUCH A LEVEL-SHIFTING CIRCUIT

[75] Inventors: Robert J. Fronen, Nijmegen; Johannes P. T. De Vries, Eindhoven, both of Netherlands

[73] Assignee: U.S. Philips Corporation, New York, N.Y.

[21] Appl. No.: 631,296

[22] Filed: Apr. 9, 1996

[30] Foreign Application Priority Data

Apr. 10, 1995 [EP] European Pat. Off. ............ 95200895

[51] Int. Cl.$^6$ .................................................. H03K 17/687
[52] U.S. Cl. ........................... 327/382; 327/108; 327/333; 327/380; 327/389; 327/390; 327/427; 327/434
[58] Field of Search ......................... 327/108, 333, 327/427, 432, 434, 478, 380, 381, 390, 382, 389; 326/64, 68, 84, 89

[56] References Cited

U.S. PATENT DOCUMENTS

| | | | |
|---|---|---|---|
| 4,577,211 | 3/1986 | Bynum et al. | 327/564 |
| 4,705,962 | 11/1987 | Kinoshita et al. | 327/427 |
| 5,051,613 | 9/1991 | Houser, Jr. et al. | 327/544 |
| 5,084,633 | 1/1992 | Izadinia | 327/427 |
| 5,134,322 | 7/1992 | Bourgeois et al. | 327/381 |
| 5,218,523 | 6/1993 | Sugishima | 363/132 |
| 5,296,756 | 3/1994 | Patel et al. | 326/21 |
| 5,365,118 | 11/1994 | Wilcox | 327/427 |
| 5,475,340 | 12/1995 | Gose | 327/565 |
| 5,552,731 | 9/1996 | Diazzi et al. | 327/427 |
| 5,565,810 | 10/1996 | Hammel et al. | 327/432 |

FOREIGN PATENT DOCUMENTS

| | | |
|---|---|---|
| 0330628B1 | 8/1989 | European Pat. Off. . |
| 0437409A1 | 7/1991 | European Pat. Off. . |
| 63-103516 | 5/1988 | Japan ............ 327/432 |

OTHER PUBLICATIONS

Schultz, PCIM—"Drive Techniques for High Side N–Channel MOSFETS", pp. 34–40, Jun. 1987.

*Primary Examiner*—Terry Cunningham
*Attorney, Agent, or Firm*—Leroy Eason

[57] ABSTRACT

A level-shifting circuit ($LS_A$) including a series arrangement of a load resistor ($R_A$), a main current path of an input transistor and a bipolar series transistor ($T3_A$) arranged as a current source and having a parasitic transistor with a small current gain factor, which is obtained, for example, by wholly surrounding the comparatively weakly doped collector region with a comparatively heavily doped material of the same conductivity type as the collector region. When the input transistor ($T1_A$) is not conductive a large amount of charge accumulates in the series transistor ($T3_A$), which is then in saturation. When the input transistor ($T1_A$) is turned on the accumulated charge causes an overshoot in the current ($I_A$) through the level-shifter which overshoot compensates for the slow response as a result of the parasitic capacitance ($PC_A$) at the node ($N_A$).

4 Claims, 2 Drawing Sheets

LEVEL-SHIFTING CIRCUIT AND HIGH-SIDE DRIVER INCLUDING SUCH A LEVEL-SHIFTING CIRCUIT

BACKGROUND OF THE INVENTION

1. Field of the Invention

The invention relates to a level-shifting circuit which includes a series arrangement of a load resistor, the main current path of an input transistor and a current-conduction element.

The invention also relates to a high-side driver including such a level-shifting circuit. Level shifters and high-side drivers are circuits used for driving power transistors in full-bridge or half-bridge configuration, inter alia in electronic ballast circuits, in driver circuits for brushless motors, and in DC—DC converters.

2. Description of the Related Art

Such a level-shifting circuit and high-side driver are known from an article in the publication PCIM, June 1987, pp. 34–40. In this known level-shifting circuit the current conduction element is a resistor. The voltage drop across this resistor turns on a limiting transistor when a given current flows through this resistor. The limiting transistor then drains the drive signal to ground, thereby limiting the drive to the input transistor. The result of this is a limitation of the peak current through the load resistor and through the input transistor. In the case of high supply voltages, when excessive currents lead to an undesirably high dissipation in the level-shifting circuit, this limitation is particularly useful, but in many cases the limiting transistor is not essential.

The rate at which the voltage across the load resistance of the level-shifting circuit can vary is limited by parasitic capacitances. When the level-shifting circuit is used in high-side drivers the switching frequency is limited by the speed of the level-shifting circuit. Therefore, rapid level-shifting circuits are required at increasing switching frequencies.

SUMMARY OF THE INVENTION

It is an object of the invention to provide a level shifting circuit as described in the opening paragraph and which is capable of operation at high switching frequencies. Such a level shifting circuit of the type defined is characterized in that the current-conduction element is the collector-emitter path of a bipolar series transistor having a structure which also forms a parasitic transistor with a small current gain factor. As long as no current flows through the level-shifting circuit the series transistor remains saturated and charge builds up in the collector region thereof. When the input transistor is driven into conduction by the drive signal the charge in the collector region of the series transistor causes an overshoot in the current through the level-shifting circuit. This overshoot compensates for the speed of limitation of the voltage variation across the load resistance as a result of the parasitic capacitances. The series transistor acts in effect as a temporary speed-up capacitor when it desaturates. This speed-up function does not require a separate external or integrated capacitor, which would have the further drawback of being permanently and not temporarily present and may thus give rise to instabilities when the optional limiting transistor is turned on. By giving the parasitic transistor associated with the series transistor a small current gain factor, it is achieved that a maximal charge is built up in the collector region of the series transistor. That is an unusual step because it adversely affects the switching performance of a transistor. However, the invention deliberately utilises the charge build-up in the collector region of the series transistor to speed up the level-shifting circuit by the choice of a bipolar transistor in which this effect has been maximized.

The current gain factor of the parasitic transistor can be made small by providing a boundary around the comparatively weakly doped epitaxial collector region of the bipolar series transistor the boundary being either a heavily doped material of the same conductivity type or a non-conductive dielectric material.

The level-shifting circuit preferably comprises a current source for supplying a bias current to the base of the bipolar series transistor in order to obtain a well-defined charge build-up in the collector region thereof.

The input transistor may be of the bipolar type or of the unipolar (MOS) type. The unipolar type has the advantage of requiring only a small drive current and of the availability of high-voltage unipolar transistors.

For the purpose of current limiting the level-shifting circuit may further comprise a limiting transistor having a control electrode connected to receive a voltage produced at the collector of the series transistor as a result of the passage of current in the main current path of the input transistor, and having a main current path coupled to a control electrode of the input transistor in order to limit a drive signal applied to the control electrode of the input transistor.

The limiting transistor thus limits the voltage drop across the series transistor. It may also be of the bipolar or unipolar type. The bipolar type has the advantage of a low threshold voltage.

The level-shifting circuit is very suitable for use in high-side drivers, particularly in a high-side driver arrangement comprising:

an input stage for supplying complementary first and second drive signals in response to a switching signal;

a set-reset flip-flop having a set input, a reset input and a logic output for supplying a driver signal for a high-side switching transistor having a main current path coupled to a load terminal;

and a first and a second level-shifting circuit, each comprising:

a series arrangement of a load resistor, the main current path of an input transistor and a current-conduction element;

the set and reset inputs of the flip-flop being respectively coupled to the load resistors of the first and second level-shifting circuit, and wherein each of the current-conduction elements is a bipolar transistor having a structure which includes a parasitic transistor, such parasitic transistor having a small current gain factor.

Such a configuration is highly immune to the large signal transients at load terminal because the set input and the reset input are equally affected by these signal transients.

BRIEF DESCRIPTION OF THE DRAWINGS

These and other aspects of the invention will be described and elucidated with reference to the accompanying drawings, in which.

In these Figures items or parts with the same function or purpose bear like reference symbols.

DESCRIPTION OF THE PREFERRED EMBODIMENTS

Figure 1:
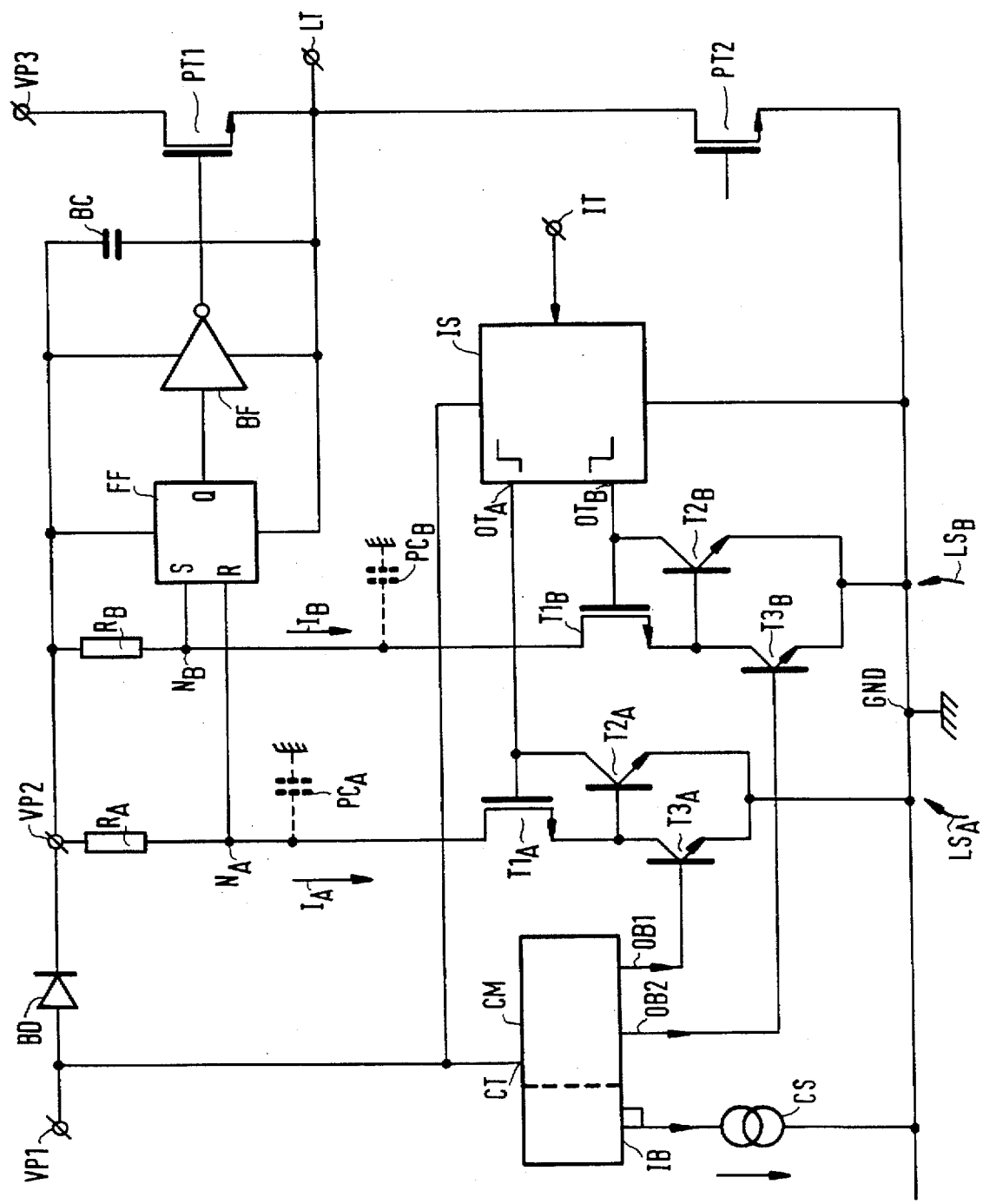
FIG. 1 shows a high-side driver arrangement with two level-shifting circuits in accordance with the invention.

FIG. 1 shows two level-shifting circuits $LS_A$ and $LS_B$ used in a high-side driver. The level-shifting circuit $LS_A$ comprises a load resistor $R_A$, the main current path of an NMOS input transistor $T1_A$ and the collector-emitter path of a bipolar NPN series transistor $T3_A$, arranged in series in that order between a positive supply terminal VP2 and a ground terminal GND. The level-shifting circuit $LS_A$ further comprises an (optional) bipolar NPN limiting transistor $T2_A$, having its collector connected to the control electrode or gate of the transistor $T1_A$, its emitter to the ground terminal GND, and its base to the node between the source of the transistor $T1_A$ and the collector of the transistor $T3_A$. The drain of the transistor $T1_A$ and the load resistor $R_A$ are interconnected at a node $N_A$, at which a parasitic capacitance exists, represented as a capacitor $PC_A$ shown in broken lines. The base of the transistor $T3_A$ receives a bias current from an output branch OB1 of a current mirror CM having its input branch IB connected to the ground terminal via a current source CS. The common terminal CT of the current mirror CM is connected to a positive supply terminal VP1. The current mirror may be constructed with bipolar transistors, but any other alternative construction is suitable.

The second level-shifting circuit $LS_B$ is identical to the first level-shifting circuit $LS_A$ and all corresponding elements bear an index B for the sake of distinction. The base of the transistor $T3_B$ receives a bias current from another output branch OB2 of the current mirror CM.

The two level-shifting circuits $LS_A$ and $LS_B$ are alternately turned on by an input stage IS having an output terminal $OT_A$ for driving the gate of the transistor $T1_A$, an output terminal $OT_B$ for driving the gate of the transistor $T1_B$, and an input terminal IT for receiving a switching signal. The output terminals $OT_A$ and $OT_B$ supply complementary drive signals to the gates of the transistors $T1_A$ and $T1_B$. The nodes $N_A$ and $N_B$ are coupled to the set input S and the reset input R of a flip-flop FF whose Q output drives the control electrode of a power transistor PT1, in the present case an NMOS transistor. The source of the power transistor PT1 and the ground terminals of the flip-flop FF and the buffer BF are all connected to a load terminal LT. The drain of the power transistor PT1 is connected to a positive supply terminal VP3, to which a positive supply voltage can be applied which is normally much higher than the supply voltage on the supply terminal VP1. Furthermore, a second power transistor PT2, in the present case also an NMOS transistor, is arranged between the load terminal LT and the ground terminal GND and is driven with a suitable drive signal from means, not shown, in such a manner that the power transistors PT1 and PT2 are not driven into conduction at the same time.

In known manner the positive supply terminal VP2 is connected to the load terminal LT via a bootstrap capacitor BC and to the positive supply terminal VP1 via a bootstrap diode BD. When the power transistor PT2 conducts the bootstrap capacitor is charged via the bootstrap diode BD to substantially the positive supply voltage on the supply terminal VP1. When the power transistor PT1 conducts, the voltage on the supply terminal VP2 is raised above the supply voltage on the supply terminal VP1 by a value equal to the voltage difference between the supply terminal VP3 and the ground terminal GND. The bootstrap diode BD is then cut off. Thus, it is possible to apply a sufficiently high positive drive voltage to the gate of the power transistor PT1.

The flip-flop FF, the two level-shifters $LS_A$, $LS_B$ and the input stage IS ensure that the high-side power transistor PT1 is turned on and turned off in a balanced and symmetrical manner, this process of turning on/off being highly immune to the often very steep signal edges on the load terminal LT. This is because these edges have a similar effect on the set input and on the reset input of the flip-flop FF.

The input stage IS turns on one of the two level-shifting circuits, for example $LS_A$. This results in a current $I_A$ through the load resistor $R_A$, the transistor $T1_A$ and the transistor $T3_A$, which functions as a current source. The current $I_A$ is limited in that the transistor $T2_A$ is turned on as soon as the voltage drop across the transistor $T3_A$ exceeds the threshold voltage of the transistor $T2_A$. Current limiting is necessary to preclude an excessive dissipation in the level-shifting circuit. If desired, however, the limiting transistors $T2_A$ and $T2_B$ may be omitted. The nominal value of the current $I_A$ is determined by the current supplied to the base of the transistor $T3_A$ and the current gain of the transistor $T3_A$. The current $I_B$ through the other level-shifting circuit $LS_B$ is than zero but the transistor $T3_B$ yet receives a base current equal to that received by the transistor $T3_A$. The transistor $T3_B$ will therefore be saturation due to lack of collector current. Similarly, the transistor $T3_A$ is also in saturation just before turn-on of the level-shifting circuit $LS_A$, causing charge to accumulate in the collector region. This charge causes an overshoot in the current $I_A$ when the level-shifting circuit $LS_A$ is turned on, which overshoot enables a more rapid charge variation to be obtained in the parasitic capacitance $PC_A$ at the node $N_A$. This allows a higher switching frequency in turning on and turning off the power transistors PT1 and PT2.

Figure 2:
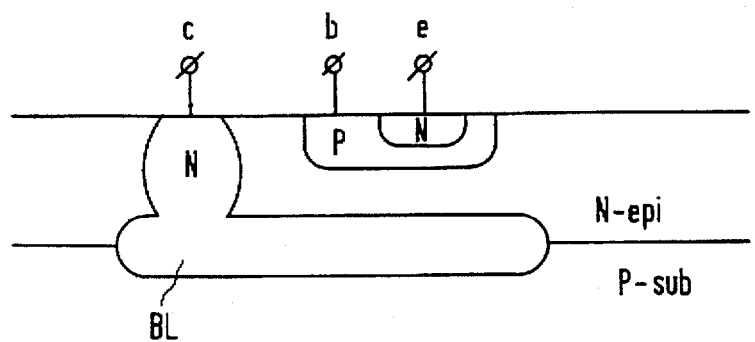
FIG. 2 shows a bipolar NPN transistor of a customary type.
Figure 3:
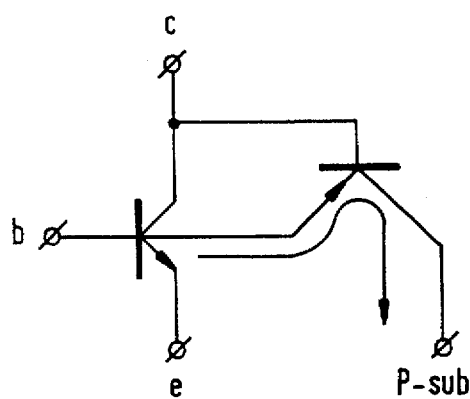
FIG. 3 shows the equivalent circuit diagram of the bipolar NPN transistor in FIG. 2.

The bipolar transistor $T3_A$, and consequently also $T3_B$, is constructed so as to obtain a maximal charge accumulation during saturation. This is achieved by making the current gain of the parasitic PNP transistor formed by the structure of the NPN transistor $T3_A$ small. FIG. 2 shows the structure of a normal NPN transistor. The parasitic PNP transistor has an emitter formed by the P material of the base region b of transistor $T3_A$, a base formed by the N material of the epitaxial layer N-epi, and a collector formed by the P material of the substrate P-sub. This results in a fairly large current gain because since the buried layer BL does not block one side of the n-epi base region there is an extended junction between that region and the p-sub collector region. During saturation of the transistor $T3_A$ the voltage on the collector c thereof becomes low, as a result of which the emitter-base junction of the parasitic PNP transistor becomes conductive and current can flow from the base b to the substrate P-sub. See FIG. 3. The amount of charge stored in the collector region c of transistor $T3_A$ is therefore limited because the parasitic PNP transistor becomes conductive. This parasitic PNP transistor drains a part of the base current directly to the P substrate instead of to the emitter of transistor $T3_A$ upon reversal of the collector-base voltage there of during saturation. This base current loss limits the stored charge. The base-emitter voltage decreases, as a result of which less electrons are injected into the base and, consequently, less electrons can accumulate in the collector region. Moreover, a part of the charge stored in the collector region is drained in the form of base current of the parasitic PNP transistor.

Figure 4:
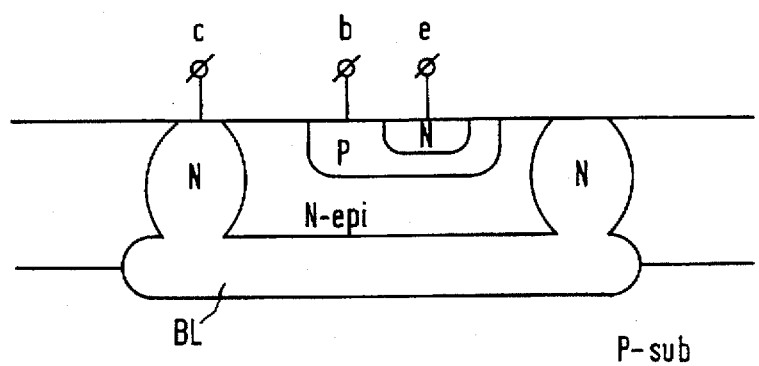
FIG. 4 shows a modified bipolar NPN transistor for use in a level-shifting circuit in accordance with the invention.

By cutting off the current path from the base b to the substrate P-sub as effectively as possible, it is achieved that the current gain factor of the parasitic PNP transistor becomes small and consequently the charge drain to the substrate P-sub during saturation becomes substantially smaller. FIG. 4 shows a first possibility of realizing this. Here, the comparatively heavily doped buried layer BL serves as a boundary around the comparatively weakly doped N-epi collector region, as a result of which the path to the substrate P-sub is cut off almost completely. Thus, the saturation current of the parasitic PNP transistor becomes very small, which results in only a small leakage current to the substrate P-sub upon reversal of the collector-base voltage of the NPN transistor. The N-epi region of the collector c is weakly doped and contains a large quantity of electrons in the saturation condition, which quantity corresponds to a few tens of picofarads. Providing a capacitor having this capacitance would be likely to cause instabilities in the feedback loop formed by the second transistor $T2_A$ during current limiting and would require a comparatively large chip area in the case of integration. However, the saturated transistor $T3_A$ having the special structure shown in FIG. 4 behaves as a normal transistor with a low collector capacitance after discharging of the collector region when the transistor has become desaturated and resumes operation in its normal linear region. The additional capacitance therefore exists only temporarily, i.e. when the current $I_A$ is switched on by the level-shifting circuit $LS_A$, and then vanishes when the current limiting becomes active.

Figure 5:
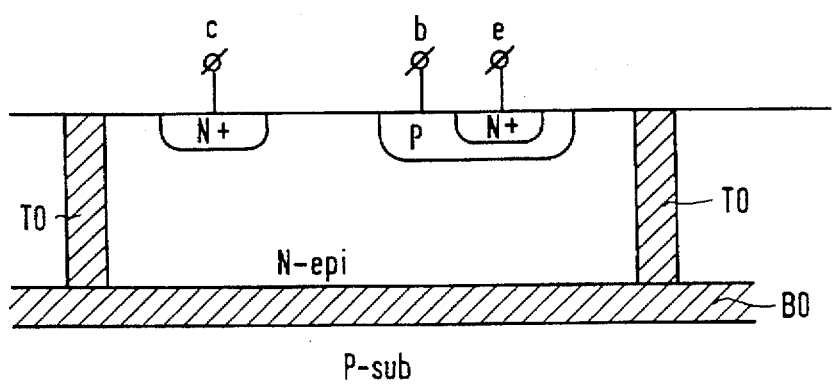
FIG. 5 shows an alternatively modified bipolar NPN transistor for use in a level-shifting circuit in accordance with the invention.

FIG. 5 shows an alternative solution for the construction of the transistor $T3_A$. Here, the collector region of the transistor $T3_A$ is surrounded with a non-conductive dielectric in the form of a trench isolation TO and an adjoining buried oxide which obstructs drainage of charge carders to the substrate P-sub.

The invention is not limited to the embodiments shown herein. The NMOS transistors $T1_A$ and $T1_B$ and the power transistors PT1 and PT2 may also be bipolar NPN transistors, in which case drain, source and gate should read collector, emitter and base. Conversely, the bipolar NPN transistors $T2_A$ and $T2_B$ may be replaced by unipolar NMOS transistors. Furthermore, it will be evident that it is also possible to use transistors of opposite conductivity types in conjunction with a supply voltage of the correct polarity.

The use of the level-shifting circuit $LS_A$ or $LS_B$ is not restricted to high-side drivers of the type as shown in FIG. 1 but extends to any application where slew-ram limitation by parasitic capacitances poses a problem.

We claim:

1. A high-side driver arrangement comprising:
    an input stage for supplying complementary first and second drive signals in response to a switching signal;
    a set-reset flip-flop having a set input, a reset input and a logic output at which a driver signal is supplied to a high-side switching transistor (PT1) having a main current path coupled to a load terminal (LT);
    first and second level-shifting circuit which each comprise a series arrangement of a load resistor, a main current path of an input transistor ($T1_A/T1_B$), and a current-conduction element ($T3_A/T3_B$); the set and reset inputs of the flip-flop being respectively coupled to the load resistors of the first and second level-shifting circuits; each of the current-conduction elements being a bipolar series transistor having a structure which also forms a parasitic transistor with a small current gain factor; and
    a current mirror having an input branch coupled to a bias current source and having two output branches respectively coupled to the bases of the bipolar series transistors ($T3_A/T3_B$) of the first and second level-shifting circuits;
    whereby in each level-shifting circuit, while the input transistor is non-conductive charge builds up in the collector region of the series transistor connected thereto, which charge is greater with a smaller current gain factor of the associated parasitic transistor and which increases the speed of voltage change across the load resistor when the input transistor is turned on by a drive signal from said input stage.

2. A high-side driver arrangement as claimed in claim 1, wherein the load resistors in the first and second level-shifting circuits are both coupled to a supply terminal (VP2) which is coupled to a supply voltage terminal (VSP1) via a bootstrap diode and to the load terminal (LT) via a bootstrap capacitor.

3. A high-side driver arrangement as claimed in claim 1, wherein the first and second level-shifting circuits each further comprise a limiting transistor ($T2_A/T2_B$) having a control electrode connected to the collector of the series transistor ($T3_A/T3_B$), at which collector a voltage is produced upon passage of current in the main current path of the input transistor ($T1_A/T1_B$), the limiting transistor having a main current path coupled to a control electrode of the input transistor in order to drain an excessive drive signal applied to said control electrode by said input stage.

4. A high-side driver arrangement as claimed in claim 1, wherein the bipolar series transistors ($T3_A/T3_B$). each have a comparatively weakly doped epitaxial collector region (N-epi) which is bounded by either (i) a layer of comparatively heavily doped material of the same conductivity type as the collector region, or (ii) a layer of non-conductive dielectric material; thereby providing a relatively small current gain factor of the parasitic transistor in each of said level-shifting circuits.

* * * * *